US00RE39628E

(19) United States
(12) Reissued Patent
Isaak

(10) Patent Number: US RE39,628 E
(45) Date of Reissued Patent: May 15, 2007

(54) STACKABLE FLEX CIRCUIT IC PACKAGE AND METHOD OF MAKING SAME

(75) Inventor: Harlan R. Isaak, San Clemente, CA (US)

(73) Assignee: Stakick Group, L.P., Austin, TX (US)

(21) Appl. No.: 10/900,073
(22) Filed: Jul. 27, 2004

Related U.S. Patent Documents

Reissue of:
(64) Patent No.: 6,426,549
Issued: Jul. 30, 2002
Appl. No.: 09/706,015
Filed: Nov. 3, 2000

U.S. Applications:
(62) Division of application No. 09/305,584, filed on May 5, 1999, now Pat. No. 6,323,060.

(51) Int. Cl.
*H01L 23/495* (2006.01)
*H01L 25/16* (2006.01)
*H01L 23/485* (2006.01)
*H01L 23/498* (2006.01)

(52) U.S. Cl. ..... 257/686; 257/685; 257/737; 257/E25.031; 257/E25.032; 257/738; 257/780; 257/E23.021; 257/E23.069; 257/781

(58) Field of Classification Search ..... 257/686, 257/685, 692, 778–781, 737–738, E25.031, 257/E25.032, E23.021, E23.069
See application file for complete search history.

(56) References Cited

U.S. PATENT DOCUMENTS 3,411,122 A 11/1968 Schiller et al.
(Continued)

FOREIGN PATENT DOCUMENTS

DE 004215467 A1 11/1992
(Continued)

OTHER PUBLICATIONS

"Design Techniques for Ball Grid Arrays," William R. Newberry, Xynetix Design Systems, Inc.

(Continued)

*Primary Examiner*—Luan Thai
(74) *Attorney, Agent, or Firm*—J. Scott Denko; Fish & Richardson P.C.

(57) ABSTRACT

A stackable flex circuit IC package includes a flex circuit comprised of a flexible base with a conductive pattern thereon, and wrapped around at least one end portion of a frame so as to expose the conductive pattern at the edge portion. An IC device is mounted within a central aperture in the frame, and is electrically coupled to the conductive pattern. The IC device is sealed in place within the frame with epoxy. A stack of the IC packages is assembled by disposing a conductive epoxy of anisotropic material between the conductive patterns at the edge portions of adjacent IC packages. Application of pressure in a vertical or Z-axis direction between adjacent IC packages completes electrical connections between the individual conductors of the conductive patterns of adjacent IC packages to interconnect the IC packages of the stack, while at the same time maintaining electrical isolation between adjacent conductors within each of the conductive patterns. The IC devices may comprise bare memory chips electrically coupled to the conductive pattern by wire bonds which are encapsulated in the epoxy together with the chip. Alternatively, where the IC devices comprise ball grid array (BGA) devices, such as chip scale packages, μBGAs, flip chips, or the like, the matrix of balls or other conductive elements on the device are disposed within apertures ablated through the flexible base of the flex circuit where they are soldered to the conductive pattern. A method of making the stackable flex circuit IC package secures the frame onto the flex circuit so that the flex circuit is wrapped around at least one end of the frame, secures the IC device to the flex circuit within the opening in the frame, electrically couples the IC device to the conductive pattern on the flex circuit, either by wire bonding in the case of a bare chip or by soldering the matrix of balls or other conductive elements to the conductive pattern of the flex circuit in the case of a BGA device, and then encapsulates the device with epoxy. A stack of the IC packages is formed by placing anisotropic conductive epoxy between the exposed conductive patterns of adjacent IC packages and pressing the IC packages together.

20 Claims, 7 Drawing Sheets

U.S. PATENT DOCUMENTS

| | | | | | |
|---|---|---|---|---|---|
| 3,436,604 | A | | 4/1969 | Hyltin | |
| 3,654,394 | A | | 4/1972 | Gordon | |
| 3,723,977 | A | * | 3/1973 | Schaufele | |
| 3,746,934 | A | | 7/1973 | Stein | |
| 3,766,439 | A | | 10/1973 | Isaacson | |
| 3,772,776 | A | | 11/1973 | Weisenburger | |
| 3,983,547 | A | | 9/1976 | Almasi | |
| 4,079,511 | A | | 3/1978 | Grabbe | |
| 4,288,841 | A | | 9/1981 | Gogal | |
| 4,406,508 | A | | 9/1983 | Sadigh-Behzadi | |
| 4,513,368 | A | | 4/1985 | Houseman | |
| 4,587,596 | A | | 5/1986 | Bunnell | |
| 4,645,944 | A | | 2/1987 | Uya | |
| 4,696,525 | A | | 9/1987 | Coller et al. | |
| 4,712,129 | A | | 12/1987 | Orcutt | |
| 4,722,691 | A | | 2/1988 | Gladd et al. | |
| 4,733,461 | A | | 3/1988 | Nakano | |
| 4,758,875 | A | | 7/1988 | Fujisawa et al. | |
| 4,763,188 | A | | 8/1988 | Johnson | |
| 4,821,007 | A | | 4/1989 | Fields et al. | |
| 4,823,234 | A | | 4/1989 | Konishi et al. | |
| 4,833,568 | A | | 5/1989 | Berhold | 361/383 |
| 4,839,717 | A | | 6/1989 | Phy et al. | |
| 4,862,249 | A | | 8/1989 | Carlson | |
| 4,891,789 | A | | 1/1990 | Quattrini et al. | |
| 4,911,643 | A | | 3/1990 | Perry et al. | |
| 4,953,060 | A | | 8/1990 | Lauffer et al. | |
| 4,956,694 | A | | 9/1990 | Eide | |
| 4,983,533 | A | | 1/1991 | Go | |
| 4,985,703 | A | | 1/1991 | Kaneyama | |
| 5,012,323 | A | | 4/1991 | Farnworth | |
| 5,016,138 | A | | 5/1991 | Woodman | |
| 5,034,350 | A | | 7/1991 | Marchisi | |
| 5,041,015 | A | | 8/1991 | Travis | |
| 5,041,902 | A | | 8/1991 | McShane | |
| 5,057,903 | A | | 10/1991 | Olla | |
| 5,064,762 | A | | 11/1991 | Nishiguchi | |
| 5,068,708 | A | | 11/1991 | Newman | |
| 5,081,067 | A | | 1/1992 | Shimizu et al. | |
| 5,099,393 | A | | 3/1992 | Bentlage et al. | |
| 5,104,820 | A | | 4/1992 | Go et al. | |
| 5,117,282 | A | | 5/1992 | Salatino | 357/81 |
| 5,122,862 | A | | 6/1992 | Kajihara et al. | |
| 5,138,430 | A | | 8/1992 | Gow, 3rd et al. | |
| 5,138,434 | A | | 8/1992 | Wood et al. | |
| 5,158,912 | A | | 10/1992 | Kellerman et al. | |
| 5,159,434 | A | | 10/1992 | Kohno et al. | |
| 5,159,535 | A | | 10/1992 | Desai et al. | |
| 5,168,926 | A | | 12/1992 | Watson et al. | |
| 5,198,888 | A | | 3/1993 | Sugano et al. | |
| 5,198,965 | A | | 3/1993 | Curtis et al. | |
| 5,214,307 | A | | 5/1993 | Davis | |
| 5,219,794 | A | | 6/1993 | Satoh et al. | |
| 5,222,014 | A | | 6/1993 | Lin | |
| 5,224,023 | A | | 6/1993 | Smith et al. | |
| 5,229,916 | A | | 7/1993 | Frankeny et al. | |
| 5,239,198 | A | | 8/1993 | Lin et al. | |
| 5,240,588 | A | | 8/1993 | Uchida | |
| 5,241,454 | A | | 8/1993 | Ameen et al. | |
| 5,243,133 | A | | 9/1993 | Engle et al. | |
| 5,247,423 | A | | 9/1993 | Lin et al. | |
| 5,252,855 | A | | 10/1993 | Ogawa et al. | |
| 5,252,857 | A | | 10/1993 | Kane et al. | |
| 5,259,770 | A | | 11/1993 | Bates et al. | |
| 5,261,068 | A | | 11/1993 | Gaskins et al. | |
| 5,262,927 | A | | 11/1993 | Chia et al. | |
| 5,276,418 | A | | 1/1994 | Klosowiak et al. | |
| 5,281,852 | A | | 1/1994 | Normington | 257/685 |
| 5,289,062 | A | | 2/1994 | Wyland | |
| 5,313,097 | A | | 5/1994 | Haj-Ali-Ahmadi et al. | |
| 4,437,235 | A | | 8/1994 | Burns | |
| 5,347,428 | A | | 9/1994 | Carson et al. | |
| 5,357,478 | A | | 10/1994 | Kikuda et al. | |
| 5,361,228 | A | | 11/1994 | Adachi et al. | |
| 5,375,041 | A | | 12/1994 | McMahon | 361/749 |
| 5,386,341 | A | | 1/1995 | Olson et al. | |
| 5,394,303 | A | * | 2/1995 | Yamaji | 361/749 |
| 5,397,916 | A | | 3/1995 | Normington | |
| 5,428,190 | A | | 6/1995 | Stopperan | 174/261 |
| 5,438,224 | A | | 8/1995 | Papageorge et al. | |
| 5,448,511 | A | | 9/1995 | Paurus et al. | 365/52 |
| 5,477,082 | A | | 12/1995 | Buckley, III et al. | |
| 5,484,959 | A | | 1/1996 | Burns | |
| 5,502,333 | A | | 3/1996 | Bertin et al. | |
| 5,523,619 | A | | 6/1996 | McAllister et al. | |
| 5,523,695 | A | | 6/1996 | Lin | |
| 5,572,065 | A | | 11/1996 | Burns | |
| 5,588,205 | A | | 12/1996 | Roane | |
| 5,594,275 | A | | 1/1997 | Kwon et al. | |
| 5,612,570 | A | | 3/1997 | Eide et al. | |
| 5,631,193 | A | | 5/1997 | Burns | |
| 5,642,055 | A | | 6/1997 | Difrancesco | |
| 5,646,446 | A | * | 7/1997 | Nicewarner et al. | 257/723 |
| 5,654,877 | A | | 8/1997 | Burns | |
| 5,657,537 | A | | 8/1997 | Saia et al. | |
| 5,677,569 | A | | 10/1997 | Choi et al. | |
| 5,729,894 | A | | 3/1998 | Rostoker et al. | |
| 5,744,827 | A | | 4/1998 | Jeong et al. | |
| 5,751,553 | A | | 5/1998 | Clayton | |
| 5,763,296 | A | | 6/1998 | Casati et al. | |
| 5,764,497 | A | | 6/1998 | Mizumo et al. | |
| 5,776,797 | A | | 7/1998 | Nicewarner, Jr. et al. | 438/107 |
| 5,778,522 | A | | 7/1998 | Burns | |
| 5,778,552 | A | | 7/1998 | Burns | |
| 5,783,464 | A | | 7/1998 | Burns | |
| 5,789,815 | A | | 8/1998 | Tessler et al. | |
| 5,801,439 | A | | 9/1998 | Fujisawa et al. | |
| 5,804,870 | A | | 9/1998 | Burns | |
| 5,805,422 | A | * | 9/1998 | Otake et al. | 361/749 |
| 5,835,988 | A | | 11/1998 | Ishii | |
| 5,841,721 | A | | 11/1998 | Kwon et al. | |
| 5,869,353 | A | | 2/1999 | Levy et al. | |
| 5,895,970 | A | * | 4/1999 | Miyoshi | 257/696 |
| 5,899,705 | A | | 5/1999 | Akram | |
| 5,917,709 | A | | 6/1999 | Johnson et al. | |
| 5,922,061 | A | | 7/1999 | Robinson | |
| 5,925,934 | A | | 7/1999 | Lim | |
| 5,926,369 | A | | 7/1999 | Ingraham et al. | 361/699 |
| 5,949,657 | A | | 9/1999 | Karabatsos | |
| 5,950,304 | A | | 9/1999 | Khandros et al. | 29/831 |
| 5,953,215 | A | | 9/1999 | Karabatsos | |
| 5,959,839 | A | | 9/1999 | Gates | |
| 5,963,427 | A | | 10/1999 | Bolleson | |
| 5,973,395 | A | | 10/1999 | Suzuki et al. | |
| 5,989,982 | A | * | 11/1999 | Yoshikazu | 438/462 |
| 5,995,370 | A | | 11/1999 | Nakamori | |
| 6,002,167 | A | | 12/1999 | Hatano et al. | |
| 6,002,589 | A | | 12/1999 | Perino et al. | |
| 6,014,316 | A | | 1/2000 | Eide | 361/735 |
| 6,028,352 | A | | 2/2000 | Eide | |
| 6,028,365 | A | | 2/2000 | Akram et al. | 257/778 |
| 6,034,878 | A | | 3/2000 | Osaka et al. | |
| 6,040,624 | A | | 3/2000 | Chambers et al. | |
| 6,072,233 | A | | 6/2000 | Corisis et al. | |
| 6,084,293 | A | | 7/2000 | Ohuchi | |
| 6,084,294 | A | | 7/2000 | Tomita | |
| 6,097,087 | A | | 8/2000 | Farnworth et al. | |
| 6,121,676 | A | | 9/2000 | Solberg | 257/686 |
| RE36,916 | E | | 10/2000 | Moshayedi | |
| 6,157,541 | A | | 12/2000 | Hacke | |
| 6,165,817 | A | | 12/2000 | Akram | |

6,172,874 B1 1/2001 Bartilson ..... 361/719
6,178,093 B1 1/2001 Bhatt et al.
6,187,652 B1 2/2001 Chou et al.
6,205,654 B1 3/2001 Burns
6,208,521 B1 3/2001 Nakatsuka ..... 361/749
6,222,737 B1 4/2001 Ross
6,225,688 B1 5/2001 Kim et al. ..... 257/686
6,233,650 B1 5/2001 Johnson et al.
6,234,820 B1 5/2001 Perino et al.
6,246,114 B1 * 6/2001 Takahashi et al. ..... 257/696
6,262,895 B1 7/2001 Forthun
6,265,660 B1 7/2001 Tandy
6,266,252 B1 7/2001 Karabatsos
6,281,577 B1 8/2001 Oppermann et al. ..... 257/724
6,285,560 B1 9/2001 Lyne
6,288,907 B1 9/2001 Burns
6,300,679 B1 10/2001 Mukerji et al. ..... 257/738
6,303,981 B1 10/2001 Moden
6,310,392 B1 10/2001 Burns
6,313,998 B1 11/2001 Kledzik
6,316,825 B1 11/2001 Park et al.
6,323,060 B1 11/2001 Isaak
6,329,708 B1 12/2001 Komiyama
6,336,262 B1 1/2002 Dalal et al.
6,351,029 B1 2/2002 Isaak
6,360,433 B1 3/2002 Ross
6,368,896 B2 4/2002 Farnworth et al.
6,376,769 B1 4/2002 Chung ..... 174/522
6,392,162 B1 5/2002 Karabatsos
6,410,857 B1 6/2002 Gonya
6,426,240 B2 7/2002 Isaak
6,426,549 B1 7/2002 Isaak
6,426,560 B1 7/2002 Kawamura et al.
6,433,418 B1 8/2002 Fujisawa et al.
6,444,490 B2 9/2002 Bertin et al.
6,444,921 B1 9/2002 Wang et al. ..... 174/260
6,446,158 B1 9/2002 Karabatsos
6,449,159 B1 9/2002 Haba
6,452,826 B1 9/2002 Kim et al.
6,462,412 B2 10/2002 Kamei et al.
6,465,877 B1 10/2002 Farnworth et al.
6,465,893 B1 10/2002 Khandros et al. ..... 257/777
6,473,308 B2 10/2002 Forthun
6,486,544 B1 11/2002 Hashimoto ..... 257/686
6,489,178 B2 12/2002 Coyle et al.
6,489,687 B1 12/2002 Hashimoto
6,492,718 B2 12/2002 Ohmori
6,509,639 B1 1/2003 Lin
6,514,793 B2 2/2003 Isaak
6,528,870 B2 3/2003 Fukatsu et al.
6,552,910 B1 4/2003 Moon et al.
6,560,117 B2 5/2003 Moon
6,572,387 B2 6/2003 Burns et al.
6,576,992 B1 6/2003 Cady et al.
6,588,095 B2 7/2003 Pan
6,590,282 B1 7/2003 Wang et al.
6,600,222 B1 7/2003 Levardo
6,614,664 B2 9/2003 Lee
6,620,651 B2 9/2003 He et al.
6,627,984 B2 9/2003 Bruce et al.
6,627,997 B1 * 9/2003 Eguchi et al. ..... 257/777
6,657,134 B2 12/2003 Spielberger et al.
6,660,561 B2 12/2003 Forthun
6,677,670 B2 1/2004 Kondo
6,683,377 B1 1/2004 Shim et al.
6,690,584 B2 2/2004 Uzuka et al.
6,699,730 B2 3/2004 Kim et al.
6,707,684 B1 3/2004 Andric et al.
6,709,893 B2 3/2004 Moden et al.
6,768,660 B2 7/2004 Kong et al.
6,781,240 B2 8/2004 Choi et al.
6,803,651 B1 10/2004 Chiang
6,812,567 B2 11/2004 Kim et al.
6,833,984 B1 12/2004 Belgacem
6,849,949 B1 2/2005 Lyu et al.
6,876,074 B2 4/2005 Kim
6,884,653 B2 4/2005 Larson
6,891,729 B2 5/2005 Ko et al.
6,908,792 B2 6/2005 Bruce et al.
6,914,324 B2 7/2005 Rapport et al.
6,919,626 B2 7/2005 Burns
2001/0006252 A1 7/2001 Kim et al.
2001/0013423 A1 8/2001 Dalal et al.
2001/0015487 A1 8/2001 Forthun
2001/0035572 A1 11/2001 Isaak
2001/0040793 A1 11/2001 Inaba
2002/0006032 A1 1/2002 Karabatsos
2002/0030995 A1 3/2002 Shoji
2002/0048849 A1 4/2002 Isaak
2002/0076919 A1 6/2002 Peters et al.
2002/0101261 A1 8/2002 Karabatsos
2002/0139577 A1 10/2002 Miller
2002/0164838 A1 11/2002 Moon et al.
2002/0180022 A1 12/2002 Emoto
2003/0016710 A1 1/2003 Kamoto
2003/0045025 A1 3/2003 Coyle et al.
2003/0049886 A1 3/2003 Salmon
2003/0081392 A1 5/2003 Cady et al.
2003/0107118 A1 6/2003 Pflughaupt et al.
2003/0109078 A1 6/2003 Takahashi et al.
2003/0168725 A1 9/2003 Wamer et al.
2004/0000708 A1 1/2004 Rapport et al.
2004/0021211 A1 2/2004 Damberg
2004/0031972 A1 2/2004 Pflughaupt et al.
2004/0045159 A1 3/2004 DiStefano et al.
2004/0065963 A1 4/2004 Kamezos
2004/0075991 A1 4/2004 Haba et al.
2004/0099938 A1 5/2004 Kang et al.
2004/0104470 A1 6/2004 Bang et al.
2004/0115866 A1 6/2004 Bang et al.
2004/0150107 A1 8/2004 Cha et al.
2004/0157352 A1 8/2004 Beroz et al.
2004/0203190 A1 10/2004 Pflughaupt et al.
2004/0217461 A1 11/2004 Damberg
2004/0217471 A1 11/2004 Haba
2004/0238931 A1 12/2004 Haba et al.
2004/0245617 A1 12/2004 Damberg et al.
2005/0018495 A1 1/2005 Bhakta et al.
2005/0035440 A1 2/2005 Mohammed
2005/0040508 A1 2/2005 Lee
2005/0133897 A1 6/2005 Baek et al.

FOREIGN PATENT DOCUMENTS

DE 004214102 A1 12/1992
EP 0426-303 A2 10/1990
JP 50-29534 A 2/1983
JP 359088863 A 5/1984
JP 60-194548 * 10/1985
JP 60-254762 A 12/1985
JP 3641047659 A 3/1986
JP 62-230027 A 8/1987
JP 2-239651 * 9/1990
JP 4-209562 A 7/1992
JP 4-4368167 A 12/1992
JP 6-77644 * 3/1994
JP 63-153849 A 6/1998
JP 2000/307029 A 11/2000
JP 2001/077294 A 3/2001
JP 2001/085592 A 3/2001
JP 2001/332683 A 11/2001
JP 2003/037246 A 2/2003
JP 2003/086761 A 3/2003

| | | | |
|---|---|---|---|
| JP | 2003/088760 | A | 3/2003 |
| JP | 2003/309246 | A | 10/2003 |
| JP | 2003/309247 | A | 10/2003 |
| JP | 2003/347475 | A | 12/2003 |
| JP | 2003/347503 | A | 12/2003 |
| WO | WO 03/037053 | A1 | 5/2003 |

OTHER PUBLICATIONS

Tessera uZ Ball Stack Package, 4 figures that purport to be directed to the uZ—Ball Stacked Memory, 1 Page.

Flexible Printed Circuit Technology—A Versatile Interconnection Option. (Website 2 pages) Fjelstad, Joseph. Dec. 3, 2002.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Chip Scale Review Online—An Independent Journal Dedicated to the Advancement of Chip–Scale Electronics. (Webiste 9 pages) Fjelstad, Joseph, Pacific Consultants L.L.C., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked–CSP Delivers Flexibility, Reliability, and Space–Saving Capabilities", Vol. 3, Spring 2002. Published on the Internet.

Tessera Technologies, Inc.—Semiconductor Intellectual Property, Chip Scale Packaging—Website pages (3), Internet.

Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.

Chip Scale Packaging and Redistribution, Paul A. Magill, Glenn A. Rinne, J. Daniel Mis, Wayne C. Machon, Joseph W. Baggs, Unitive Electronics Inc.

Dense–Pac Microsystems, 16 Megabit High Speed CMOS SRAM DPS1MX16MKn3.

Dense–Pac Microsystems, 256 Megabyte CMOS DRAM DP3ED32MS72RW5.

Dense–Pac Microsystems, Breaking Space Barriers, 3–D Technology 1993.

Dense–Pac Microsystems, DPS512X16A3, Ceramic 512K X 16 CMOS SRAM Module.

IBM Preliminary 168 Pin SDRAM Registered DIMM Functional Desciption & Timing Diagrams.

3D Interconnection for Ultra–Dense Multichip Modules, Christian Val, Thomson–CSF DCS Computer Division, Thierry Lemoine, Thomson–CSF RCM Radar Countermeasures Division.

High Density Memory Packaging Technology High Speed Imaging Applications, Dean Frew, Texas Instruments Incorporated.

Vertically–Intergrated Package, Alvin Weinberg, Pacesetter, Inc. and W. Kinzy Jones, Florida International University.

1992 Proceedings, 42nd Electronic Components & Technology Conference, May 18–20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Waier Scale Integration Technology, International Electron Device Meeting, IEDM Technical Digest, Washington, D.C., Dec. 6–9, 1987.

Anonymous, Organic Card Device Carrier, Research Disclosure, May 1990, No. 313.*

* cited by examiner

STACKABLE FLEX CIRCUIT IC PACKAGE AND METHOD OF MAKING SAME

Matter enclosed in heavy brackets [ ] appears in the original patent but forms no part of this reissue specification; matter printed in italics indicates the additions made by reissue.

This is a division of Ser. No. 09/305,584 filed May 5, 1999 *now U.S. Pat. No. 6,323,060.*

BACKGROUND OF THE INVENTION

1. Field of the Invention

The present invention relates to stacks in which a plurality of integrated circuit (IC) packages arranged in a stack are electrically connected in a desired fashion, and to methods of making such stacks.

2. History of the Prior Art

Various common approaches are used to increase memory capacity on a circuit board. Larger memory IC devices such as chips can be used, if available. The size of the circuit board can be increased in order to hold more IC chips. Vertical plug-in boards can be used to increase the height of the mother board. The memory devices can be stacked in pancake style (sometimes referred to as 3D packaging or Z-Stacking). The Z-Stacking approach interconnects from 2 to as many as 8 chips in a single component which can be mounted on the "footprint" of a single package device. This approach is the most volumetrically efficient. Package chips in TSOP (thin small outline package) or LCC (leadless chip carrier) form have been used for stacking, and are perhaps the easiest to use. Bare chips or dies have also been used, but the process for forming a stack thereof tends to be complex and not well adapted to automation.

In forming a stack of IC chips such as memory chips, the chips must be formed into a stack and at the same time must be electrically interconnected in the desired fashion. Typically, the chips, which are mounted within packages therefor, have most of the electrical contacts thereof coupled in common or in parallel to contacts on a supporting substrate, and several unique contacts which are coupled individually to the substrate to the exclusion of the other chips. The prior art includes various different arrangements for electrically interconnecting the IC chips in a stack. For example, electrical conductors which may comprise thin film metal on an insulating base may be disposed perpendicular to the planes of the planar chips so as to connect those conductors on each chip which are exposed through openings in an insulating layer. Where the chip packages are assembled into a stack, electrical connections may be accomplished by lead frames or solder strips extending along the sides of the stack and attached to the electrical contacts of the chips.

Another common technique for providing the desired electrical interconnections in a chip stack is to form a stack of chips having bonding pads disposed on the chips adjacent the outer edges thereof. After assembling the stack of chips, the chip edges are ground flat and polished before sputtering an insulating layer thereon. The bonding pads on the edges of the chips are masked during the sputtering process to avoid covering them with the insulating layer. Next, a metal layer is sputtered onto the entire edge of the stack in conjunction with photomasking which forms conductive traces of the metal layer in desired locations for connecting the bonding pads.

Further examples of vertical stacks of IC chips and various methods of making such stacks are provided by U.S. Pat. Nos. 4,956,694, 5,313,096 and 5,612,570, which patents are commonly assigned with the present application. U.S. Pat. Nos. 5,612,570, which issued Mar. 18, 1997 and is entitled CHIP STACK AND METHOD OF MAKING THE SAME, describes a chip stack and a method for making the same in which chip packages are first assembled by mounting plastic packaged chips or thin, small outline package chips (TSOPs) within the central apertures of thin, planar frames having a thickness similar to the thickness of the packaged chip. Leads at opposite ends of the package are soldered to conductive pads on the upper surface of the surrounding frame. Each frame also has other conductive pads on the upper and lower surface thereof adjacent the outer edges of the frame, which are coupled to the conductive pads that receive the leads of the packaged chip by conductive traces and vias. A chip stack is then formed by stacking together a plurality of the chip packages and dipping the upper edges of the stack into molten solder to solder together the conductive pads adjacent the outer edges of the frames. The conductive pads adjacent the outer edges of the frame can be interconnected in a stair step arrangement, and pads on opposite sides of each frame can be coupled in offset fashion using vias, in order to achieve desired electrical interconnections of the various chips.

A still further example is provided by copending application Ser. No. 08/935,216, filed Sep. 22, 1987 and entitled CHIP STACK AND METHOD OF MAKING SAME. Such application, which is commonly assigned with the present application, describes formation of a stack of ball grid array IC packages by assembling a ribbon-like structure of thin, planar bases, each with plural terminals and an interconnecting conductive pattern thereon, and with the bases electrically interconnected by flex circuits extending therebetween. A different IC package is mounted on each base by soldering the balls of a ball grid array thereon to the terminals of the base. The bases alternate in orientation, so that alternate IC packages are joined to the tops and bottoms of the bases. The resulting arrangement is then folded over on itself, with IC packages being joined to adjacent bases using adhesive. The resulting chip stack is mounted on a substrate by soldering the balls of the ball grid array at the underside of the lowermost base at the bottom of the stack to the substrate. The conductive patterns on the bases and the interconnecting flex circuits form conductive pads which contact selected terminals of the various IC packages as the pads extend in alternating fashion through the stack between opposite sides of the stack.

A still further example is provided by copending application Ser. No. 08/971,499, filed Nov. 17, 1997 and entitled METHOD OF MAKING CHIP STACKS. Such application, which is commonly assigned with the present application, describes the making of a chip stack which begins with the formation of a plurality of panels having apertures therein and conductive pads on opposite sides thereof. Solder paste is deposited on the conductive pads prior to mounting plastic packaged IC chips within each of the apertures in each of the panels so that opposite leads thereof reside on the conductive pads at opposite sides of the apertures. The plural panels are then assembled into a stack, such as by use of a tooling jig which aligns the various panels and holds them together in compressed fashion. The assembled panel stack is heated so that the conductive paste solders the leads of the packaged chips to the conductive pads and interfacing conductive pads of adjacent panels together, to form a panel stack comprised of a plurality of chip package stacks. Following cleaning of the panel stack to remove solder flux residue, the individual chip package stacks are separated from the panel stack by cutting and breaking the stack. Score lines across the topmost panel and transverse slots within remaining panels therebelow result in the formation of strips of chip package stacks when longitudinal cuts are made through the panel stack. The remaining portions of the uppermost panel within such strips are then snapped along the score lines thereof to separate the individual chip package stacks from the strips.

A still further example is provided by copending application Serial No. 09/073,254, filed May 5, 1998 and entitled CHIP STACK AND METHOD OF MAKING SAME. Such application, which is commonly assigned with the present application, describes a stackable carrier made from plural layers of Kapton or other plastic material, and which may be made using conventional flex circuit techniques. The stackable carrier has a central opening, a plurality of stacking apertures extending through the thickness thereof between opposite surfaces of the carrier and a conductive pattern therein which extends between the central opening and the stacking apertures. An IC device is mounted within the central opening, and is electrically coupled to the conductive pattern such as by wire bonding or by soldering a ball grid array or other arrangement of contacts on the device directly to the conductive pattern, and is encapsulated therein with potting compound using conventional chip-on-board encapsulation technology, to form a single layer integrated circuit element. Conductive elements such as metallic balls are inserted into the stacking apertures, and are mounted therein using solder or conductive epoxy, so as to electrically contact the conductive pattern and form a stackable IC package. A stack of the IC packages is assembled by arranging a stack of the packages so that the metallic balls which protrude from a surface of each package are inserted into the stacking apertures of an adjacent package, where they are electrically and mechanically secured by solder or conductive epoxy. Balls mounted within the stacking apertures of a lowermost one of the IC packages protrude from the bottom surface thereof, so that the completed stack forms a ball grid array product.

The various arrangements and methods described in the patents and patent applications noted above have been found to provide IC package stacks and methods which are advantageous and which are suited for many applications. Nevertheless, the provision of further alternative arrangements and methods would be advantageous. In particular, it would be advantageous to provide IC package stacks and methods of making such stacks which utilize available materials and known process techniques, including particularly flex circuit technology. The assembly of such stacks should lend itself to automated production methods, and thus be competitive with other stacking approaches.

BRIEF SUMMARY OF THE INVENTION

The foregoing objects and features are achieved in accordance with the invention by an IC package stack and method of making the same which uses available materials and known process techniques and in which automated production methods can be used. A stackable flex circuit IC package in accordance with the invention includes an IC device and a flex circuit comprised of a flexible base with a conductive pattern disposed thereon. The IC device is mounted within a central aperture in a frame, and the flex circuit is wrapped around at least one end portion of the frame so as to expose the conductive pattern thereat. The IC device is electrically coupled to the conductive pattern. The conductive pattern of the flex circuit is comprised of a plurality of spaced-apart conductors. A stack of the stackable flex circuit IC packages may be formed, and the plurality of spaced-apart conductors of the flex circuits of adjacent IC packages are electrically coupled, such as by use of anisotropic conductive epoxy. By pressing the adjacent IC packages together, the conductive epoxy forms connections between the adjacent IC packages in a vertical or Z-axis direction while maintaining the spaced-apart conductors of the conductive pattern within each flex circuit electrically isolated from one another.

When the IC devices comprise bare chips, the chip is electrically coupled to the conductive pattern of the flex circuit using wire bonds coupled between conductive pads of the chip and the conductive pattern of the flex circuit. A potting compound is applied to encapsulate the chip and the wire bonds within the frame. Alternatively, the IC devices may comprise BGA (Ball Grid Array) devices, such as chip scale packages, μBGAs, flip chips, and the like, in which event an array of ball contacts or other conductive elements of the BGA device are disposed within apertures, formed such as by ablation, through the flexible base of the flex circuit. The balls of the grid pattern are soldered to the conductive pattern of the flex circuit to accomplish the electrical coupling. A potting compound is used to underfill a space between the surface of the chip having the ball grid array of contacts and the flexible base of the flex circuit.

Where the stackable flex circuit IC package has a bare chip mounted within a central aperture in the frame, the frame may be of elongated configuration with opposite ends of the flex circuit being mounted on the opposite step down ends of the frame so as to extend thereover and expose the conductive pattern at each of such opposite ends of the frame. Where a stack of the IC packages is assembled, a lowermost one of the packages in the stack may be provided with a plurality of contacts on the conductive pattern at each of the opposite ends to facilitate coupling and electrical interconnection of the stack to a substrate board. Within each IC package, the flex circuit extends across the central aperture in the frame, and the IC device is secured thereto within the aperture. Alternatively, in order to provide a thinner IC package, the flex circuit may be provided with a central aperture therein in the region of the central aperture in the frame. The IC device is disposed in the central aperture of the flex circuit so that a bottom surface of the IC device is generally coplanar with an adjacent lower surface of the flex circuit opposite the frame.

Where the IC package is formed using a BGA device, a central portion of the flex circuit has a plurality of holes ablated or otherwise formed therethrough in an array which corresponds with an array of conductive elements on the device. The conductive pattern is formed on the flex circuit so as to extend between the holes and four opposite edges of the flex circuit. After securing the frame to the flex circuit and the device to the flex circuit and mounting the device within the central aperture in the frame, the array of balls or other conductive elements at the bottom of the device are soldered to the conductive pattern on the flex circuit, with the balls disposed within the apertures in the flex circuit. The four opposite sides of the flex circuit are then wrapped over and bonded such as by adhesive to the frame, exposing the conductive pattern at the four edges of the frame. Upon stacking such IC packages, conductive epoxy such as anisotropic conductive epoxy is applied to the exposed conductive pattern at the four sides of the frame, and the application of pressure between adjacent IC packages completes the electrical interconnections between the individual conductors of the conductive pattern of adjacent IC packages.

A method of making a stackable flex circuit IC package in accordance with the invention includes the steps of providing a flex circuit with a conductive pattern thereon and providing a frame having an opening therein. The frame is secured onto the flex circuit so that the flex circuit is wrapped around at least one end of the frame to expose the conductive pattern at the at least one end. An IC device is secured to the flex circuit within the opening in the frame, and the device is electrically coupled to the conductive pattern on the flex circuit. The device is then encapsulated with epoxy. The flex circuit may be formed by sputtering or otherwise depositing a conductive layer on a layer of thin flexible base, followed by etching of the layer to form a desired conductive pattern. Where a bare chip is used, the electrical interconnection is accomplished by wire bonding the conductive pads of the chip to the conductive pattern of the flex circuit. In that event, the wire bonds are encapsulated as part of the step of encapsulating the chip with epoxy.

Where the IC package uses a BGA device, the step of providing a flex circuit includes forming a matrix of holes through the flexible base to the conductive pattern of the flex circuit. The ball grid array or other conductive elements of the device are disposed within the matrix of holes and coupled to the conductive pattern such as by soldering. A space between the circuit and the device is underfilled with epoxy. Thereafter, a frame having an opening therein is placed over the chip and is attached to the flex circuit, such as by adhesive. The opposite edges of the flex circuit are then folded over the frame and are bonded, again such as by adhesive.

DESCRIPTION OF THE FIGURES

A detailed description of the invention will be made with reference to the accompanying drawings, in which.

DETAILED DESCRIPTION OF THE INVENTION

Figure 1:
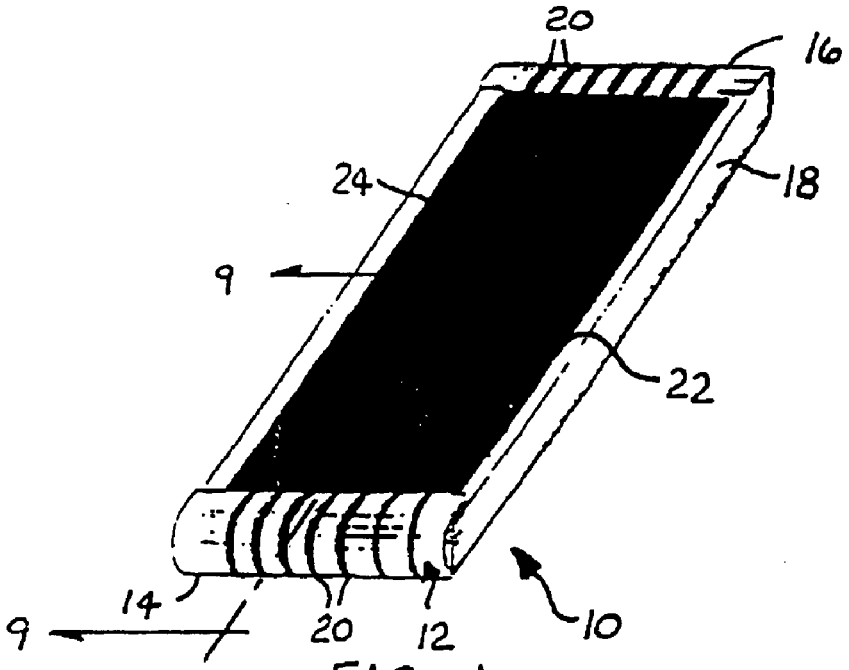
FIG. 1 is a perspective view of a stackable flex circuit IC package in accordance with the invention.

FIG. 1 depicts a stackable flex circuit IC package 10 in accordance with the invention. The IC package 10 includes a flex circuit 12 mounted on and wrapped around opposite ends 14 and 16 of an elongated frame 18. The flex circuit 12 includes a conductive pattern 20 thereon which is exposed at the opposite ends 14 and 16 of the frame 18. This facilitates electrical interconnection between adjacent IC packages when a stack of the IC packages 10 is formed, as described hereafter. The chip package 10 includes an IC device such as a memory chip or die which is hidden from view in FIG. 1 and which is shown and described in FIG. 7 hereafter. The memory chip is mounted within a central aperture 22 within the frame 18 where it is encapsulated by a quantity of potting compound in the form of epoxy 24.

Figure 3:
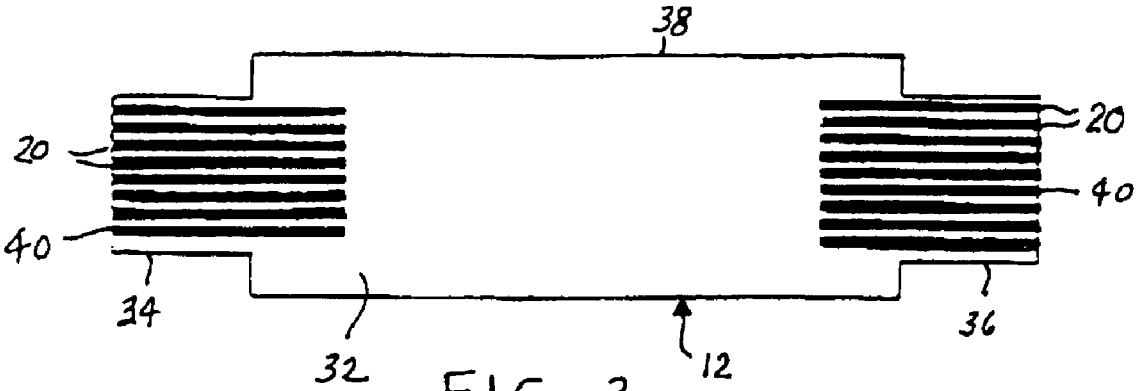
FIG. 3 is a top view of a flex circuit used in the IC package of FIG. 1.
Figure 4:
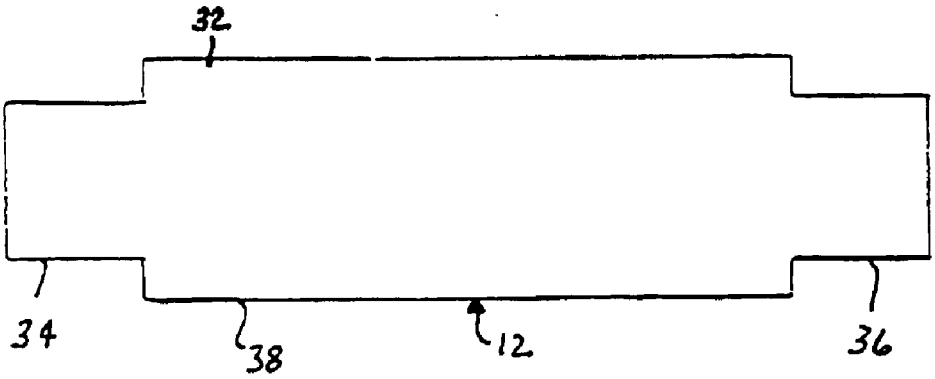
FIG. 4 is a bottom view of the flex circuit of FIG. 3.
Figure 2:
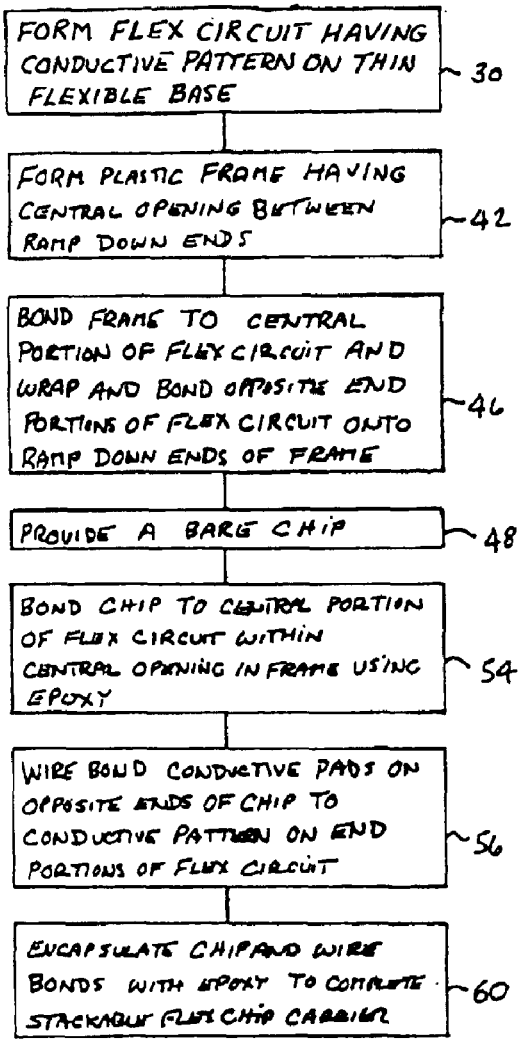
FIG. 2 is a block diagram of the successive steps of a method of making the IC package of FIG. 1.

FIG. 2 shows the successive steps of a method of making the IC package 10. In a first such step 30, the flex circuit 12 is formed by depositing a conductive layer of metal and then etching the layer of metal to form the conductive pattern 20, on a thin flexible base 32. FIG. 3 is a top view of the flex circuit 12, while FIG. 4 is an opposite bottom view of the flex circuit 12. As shown in FIGS. 3 and 4, the flex circuit 12 is of elongated configuration with opposite end portions 34 and 36 that are slightly narrower than an intermediate portion 38 therebetween. The flex circuit 12 is made using conventional flex circuit techniques. The base 32 is made of material such as Kapton or polyimide and is thin and flexible. Typically, the base 32 is several mils thick or less. The base 32 exists principally for the purpose of supporting the conductive pattern 20 thereon. The conductive pattern 20 comprises a thin layer of adhesiveless copper which is formed on the base 32 such as by sputtering. The layer of copper, which can have a thickness ranging from just a few microns to as much as 25 microns, is etched to form individual conductors which are spaced apart by very small distances such as a few mils. A pitch of 4 mils between the individual conductors is possible. This greatly increases the routing density. As shown in FIG. 3, the conductive pattern 20 is comprised of parallel, spaced-apart arrays of the individual conductors 40 at the opposite end portions 34 and 36 of the flex circuit 12.

While the flex circuit 12 is shown and described as having the conductive pattern 20 on only one side of the flexible base 32, the conductive pattern can be placed on both sides where desired to achieve various chip package configurations. As described hereafter, a laser can be used to ablate holes through the base 32 which covers portions of the conductive pattern 20. When the base 32 is ablated through, the copper of the conductive pattern 20 reflects the laser so as to be unaffected thereby.

Figure 5:
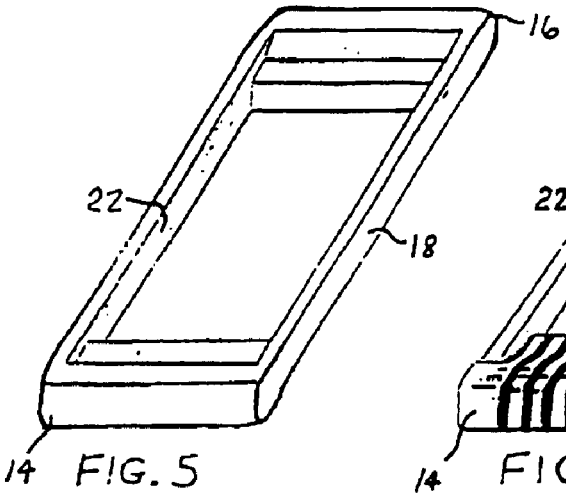
FIG. 5 is a perspective view of a frame used in the IC package of FIG. 1.

As shown in FIG. 2, a second step 42 comprises forming the frame 18. As shown in FIG. 5, the frame 18 is of elongated configuration between the opposite ends 14 and 16 thereof and has the central aperture 22 therein. The opposite ends 14 and 16 are of ramp down configuration. In the present example, the frame 18 is molded from high temperature heat resistant plastic.

Figure 6:
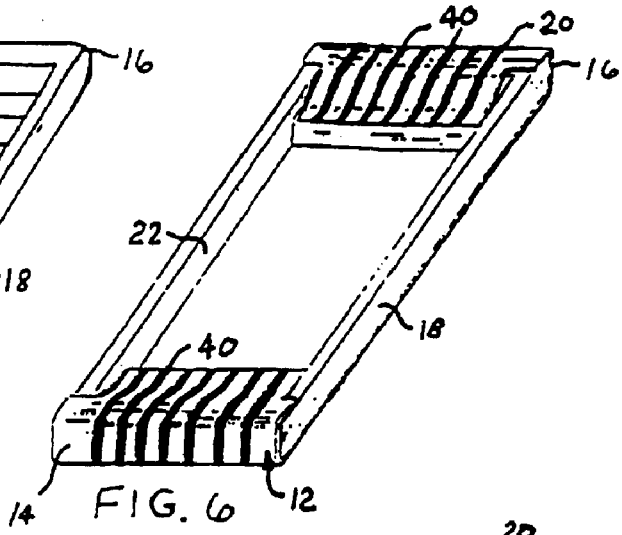
FIG. 6 is a perspective view of the frame of FIG. 5 with the flex circuit of FIG. 3 mounted thereon.

In a third step 46 of the method of FIG. 2, the frame 18 is bonded on the intermediate portion 38 of the flex circuit 12, and the end portions 34 and 36 are wrapped around and bonded to the ramp down ends of the frame 18 at the opposite ends 14 and 16 thereof. The bonding is accomplished using adhesive. The adhesive can be coated on the parts to be bonded, or a transfer adhesive can be used. The result is shown in FIG. 6. With the end portions 34 and 36 of the flex circuit 12 wrapped around and bonded to the ramp down ends of the frame 18, the conductive pattern 20 at the end portions 34 and 36 of the flex circuit 12 is exposed at the ends 14 and 16 of frame 18. This facilitates electrical interconnection of the conductive patterns 20 of adjacent IC packages 10 when a stack of the chip packages 10 is formed. It also provides for electrical interconnection of an IC device to the conductive pattern 20, as described hereinafter in connection with FIGS. 8 and 9.

Figure 7:
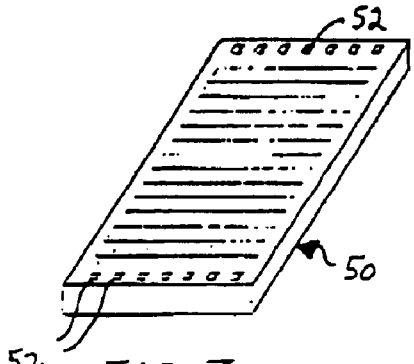
FIG. 7 is a perspective view of a bare memory chip or die used in the IC package of FIG. 1.

In a fourth step 48 of the method of FIG. 2, an IC device in the form of a bare memory chip or die 50 is provided. The chip 50, which is shown in FIG. 7, is of conventional configuration and has a plurality of terminals in the form of conductive pads 52 at opposite ends of an upper surface thereof.

In a fifth step 54 of the method of FIG. 2, the chip 50 is bonded to the intermediate portion 38 of the flex circuit 12 within the central opening or aperture 22 in the frame 18, using epoxy. This disposes the conductive pads 52 of the chip 50 adjacent the individual conductors 40 of the conductive pattern 22 at the opposite ends 14 and 16 of the flex circuit 12.

Figure 8:
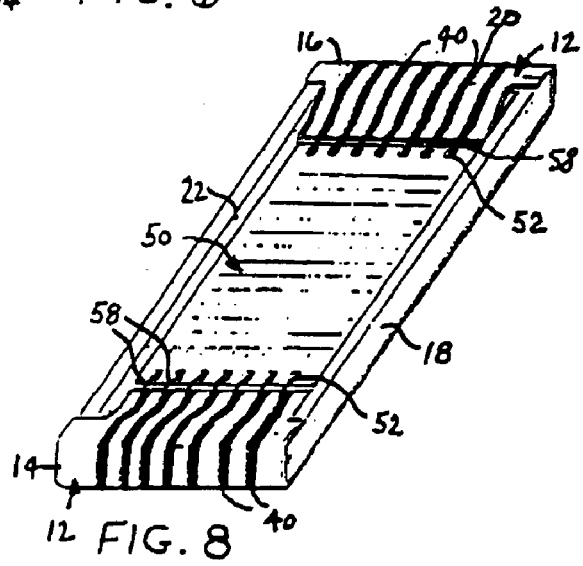
FIG. 8 is a perspective view similar to that of FIG. 6 but with the chip of FIG. 7 mounted within a central opening in the frame and electrically coupled by wire bonds to the conductive pattern of the flex circuit.
Figure 9:
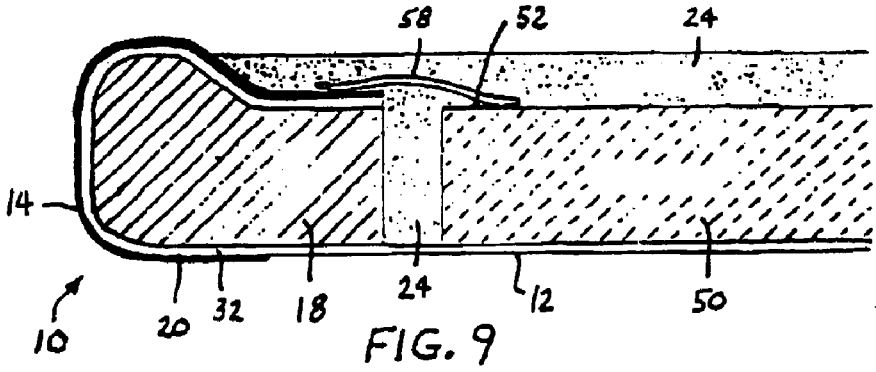
FIG. 9 is a sectional view of a portion of the IC package of FIG. 1 taken along the lines 9—9 thereof.

In a sixth step 56 of the method of FIG. 2, the conductive pads 52 of the chip are wire bonded to the conductors 40 of the conductive pattern 20 at the ends 14 and 16 of the flex circuit 12, to electrically couple the chip 50 to the conductive pattern 20. FIGS. 8 and 9 show the resulting wire bonds 58. The wire bonds 58 may be formed by wedge bonding gold or aluminum wire.

In a seventh step 60 of the method of FIG. 2, the chip 50 and the wire bonds 58 are encapsulated with the epoxy 24 shown in FIG. 1. The epoxy 24 covers the chip 50 and the wire bonds 58, and extends down around the peripheral edges of the chip 50 to seal the chip 50 in place within the frame 18. The sectional view of FIG. 9 shows the manner in which the epoxy 24 covers and encapsulates the chip 50 and the wire bonds 58. This completes the stackable flex IC package 10.

Figure 10:
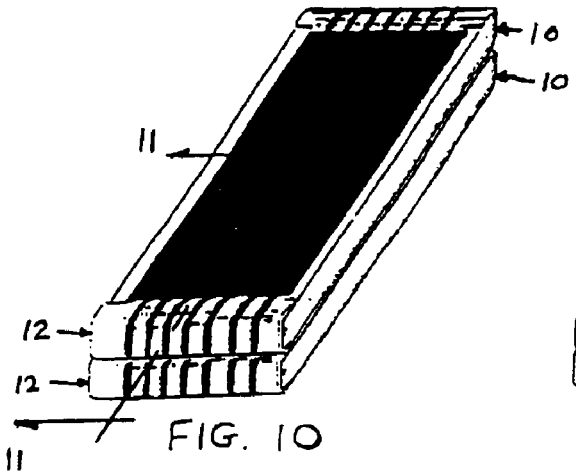
FIG. 10 is a perspective view of a stack of two of the IC packages of FIG. 1.
Figure 12:
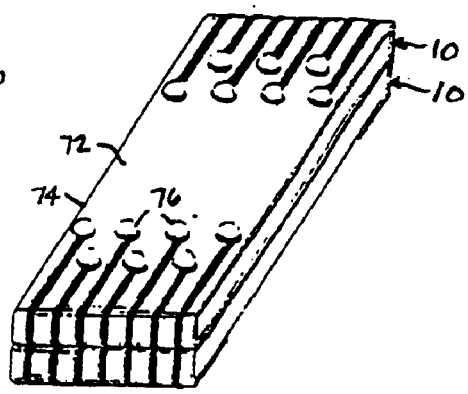
FIG. 12 is an inverted perspective view of the stack of FIG. 10 showing the manner in which the lowermost IC package is provided with an array of contacts for mounting the stack on a substrate board.

It will be appreciated by those skilled in the art that the stackable flex circuit IC package 10 utilizes readily available materials and well developed process techniques. The essence of the IC package 10 is the flex circuit 12 which routes connections from the chip 50 to peripheral positions at the ends 14 and 16 of the frame 18, allowing the IC package 10 to be stacked. FIG. 10 shows a stack of two of the IC packages 10. Because the conductive pattern 20 of the flex circuit 12 is exposed at the ends 14 and 16 of the frame 18 of each IC package 10, electrical interconnections between the conductive patterns 20 of the adjacent IC packages 10 is readily accomplished using conductive epoxy. Such epoxy also joins the IC packages 10 together within the stack. While the stack shown in FIGS. 10–12 is comprised of two of the IC packages 10, greater numbers of the IC packages 10 can be stacked by joining together each adjacent pair of the packages 10 in the manner described hereafter.

Figure 11:
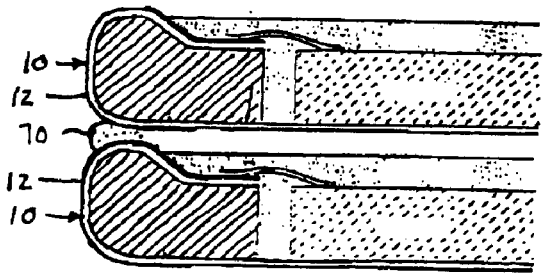
FIG. 11 is a sectional view of a portion of the stack of FIG. 10 taken along the line 11—11 thereof.

FIG. 11 shows a quantity of conductive epoxy 70 placed between the conductive patterns 20 of the flex circuits 12 of the two different IC packages 10 of the stack. The conductive epoxy 70, which contains conductive polymer particles, is an anisotropic material which becomes conductive in a Z-axis or vertical direction when pressure is applied thereto. To assemble the stack of IC packages 10, the conductive epoxy 70 is applied between the adjacent conductive patterns 20 at both ends 14 and 16 of the IC packages 10. The epoxy comes in liquid or sheet form. The IC packages 10 are then pressed together, as heat is applied. After the epoxy is cured, the IC packages 10 are bonded together and the heat and pressure may be removed. In addition to bonding, the epoxy forms electrical connections in the vertical or Z-axis direction between the individual conductors 40 of the conductive patterns 20 of the adjacent IC packages 10. However, because of the anisotropic nature of the conductive epoxy 70, electrical connections are not made in the lateral or horizontal direction. Consequently, the conductors 40 within each conductive pattern 20 remain electrically isolated from each other. There is no bridging between the conductors 40 in spite of the close pitch. This is advantageous over solder which tends to bridge between adjacent conductors and which requires a higher temperature.

To enable the stack of IC packages 10 shown in FIG. 10 to be mounted on and electrically coupled to a substrate board, the lowermost one of the IC packages 10 is provided at a lower surface thereof with a plurality of contacts. This is shown in FIG. 12 in which a bottom surface 72 of a lowermost one 74 of the IC packages 10 is provided with an array of contacts 76 thereon. The contacts 76 are electrically coupled to the conductors 40 of the conductive pattern 20 at the opposite ends 14 and 16 of the lowermost one 74 of the IC packages 10. The contacts 74 are coupled, such as by soldering, to mating contacts on the surface of a substrate board (not shown) to mount the stack of IC packages 10 and electrically couple such IC packages 10 to the substrate board.

Figure 13:
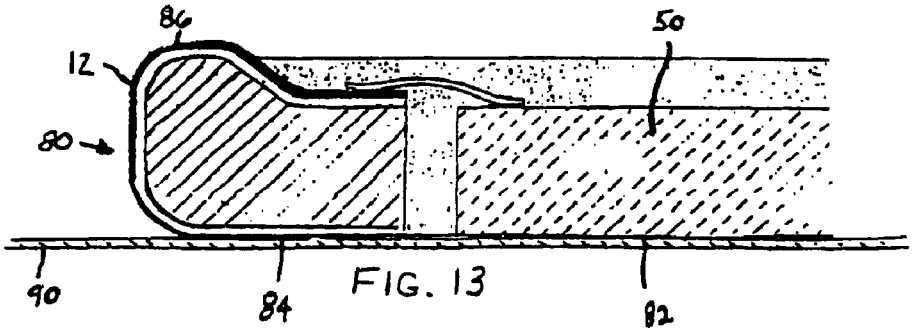
FIG. 13 is a sectional view similar to the view of FIG. 9 but showing an alternative arrangement of an IC package in which the IC device extends into a central aperture within the flex circuit.

FIG. 13 shows a variation of the IC package 10 which allows the IC package to be made somewhat thinner. An IC package 80 as shown in FIG. 13 is similar to the IC package 10 shown in FIGS. 1–12, except that the chip 50 thereof extends to the bottom of the central aperture 22 within the frame 18 and a lower surface 82 of the chip 50 is coplanar with a lower surface 84 of the flex circuit 12 at the bottom of the frame 18. This eliminates the thickness of that portion of the central or intermediate portion 38 of the flex circuit 12 which resides beneath the chip 50, in the IC package 10.

Figure 14:
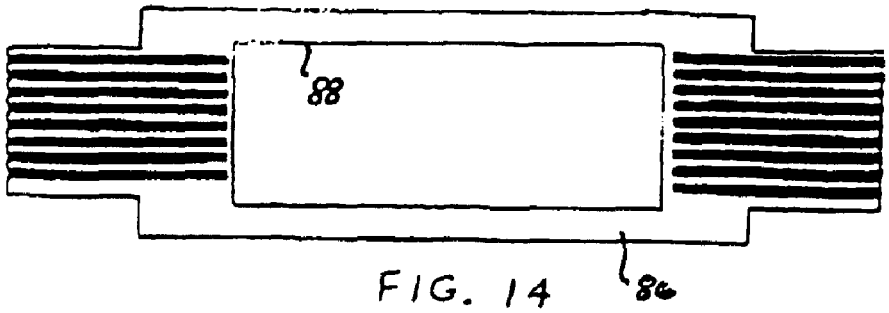
FIG. 14 is a top view of a flex circuit used in the IC package of FIG. 13.
Figure 15:
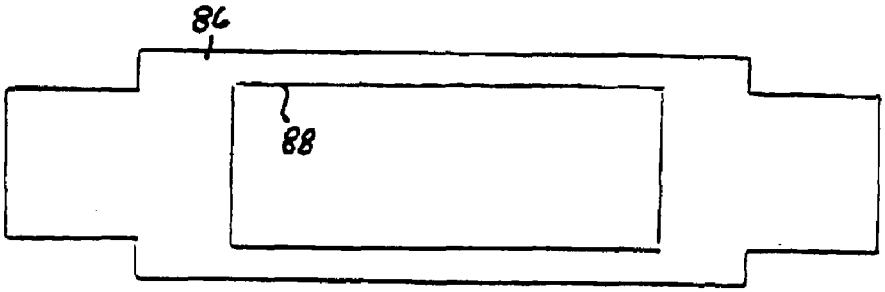
FIG. 15 is a bottom view of the flex circuit of FIG. 14.

FIGS. 14 and 15 are top and bottom views, respectively, of a flex circuit 86 used in the IC package 80 of FIG. 13. The flex circuit 86 is like the flex circuit 12 of the IC package 10, except for the presence of a central aperture 88 therethrough. The flex circuit 86 is mounted on and glued to the frame 18 including the opposite ends 14 and 16 thereof in the manner previously described in connection with the IC package 10. With the flex circuit 86 mounted on the frame 18 in this fashion, the resulting package is open to the bottom thereof through the central aperture 22 of the frame 18 and the central aperture 88 in the flex circuit 86. To mount the chip 50 so that the lower surface 82 thereof is coplanar with the lower surface 84 of the flex circuit 12 at the frame 18, a piece of Kapton tape 90 is placed across the lower surface 84 of the flex circuit 86 so as to cover the central aperture 88. The chip 50 is then lowered into place onto the Kapton tape 90 and is electrically coupled such as by wire bonding to the flex circuit 86. The epoxy 24 is then deposited over and around the chip 50, in the manner previously described. When this is completed so as to mount the chip 50 within the central aperture 22 and the frame 18, the Kapton tape 90 is removed.

Figure 18:
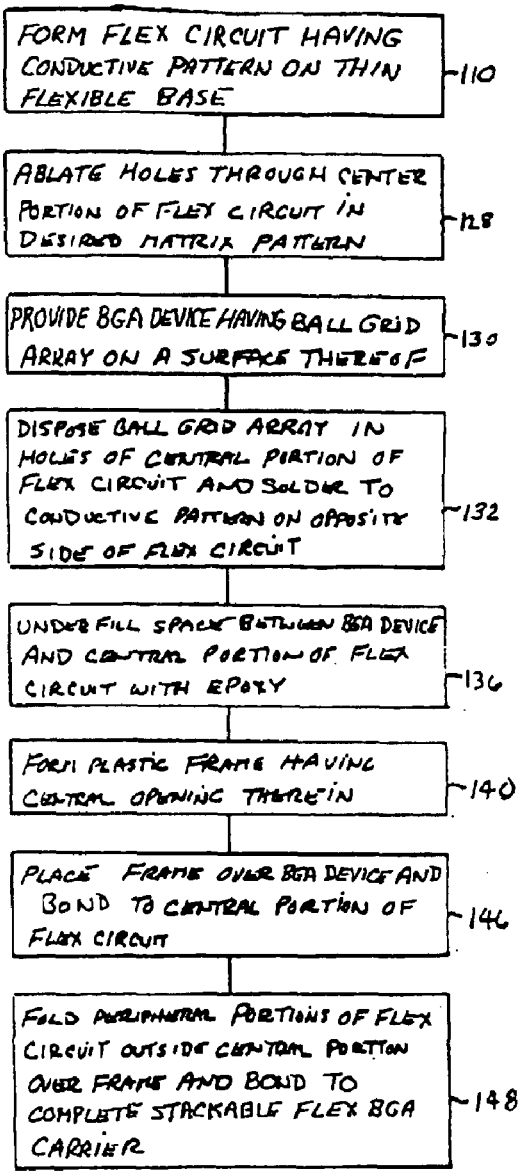
FIG. 18 is a block diagram of the successive steps of a method of making the IC package of FIG. 16.
Figure 16:
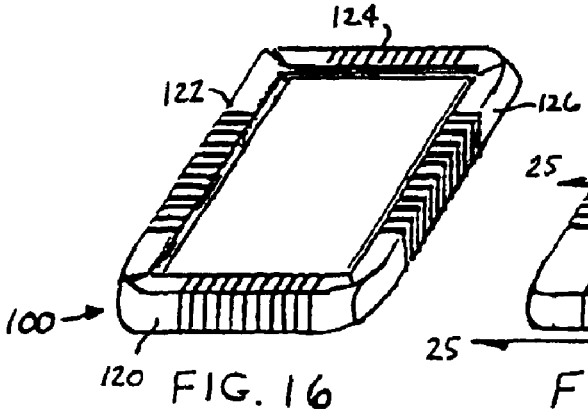
FIG. 16 is a perspective view of a stackable flex circuit IC package in accordance with the invention, which utilizes a BGA (Ball Grid Array) device.
Figure 17:
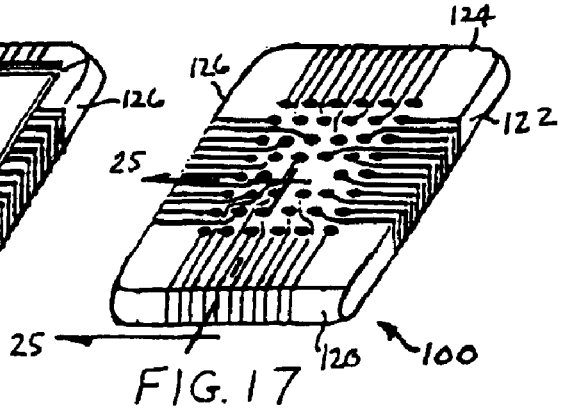
FIG. 17 is an inverted perspective view of the IC package of FIG. 16.
Figure 19:
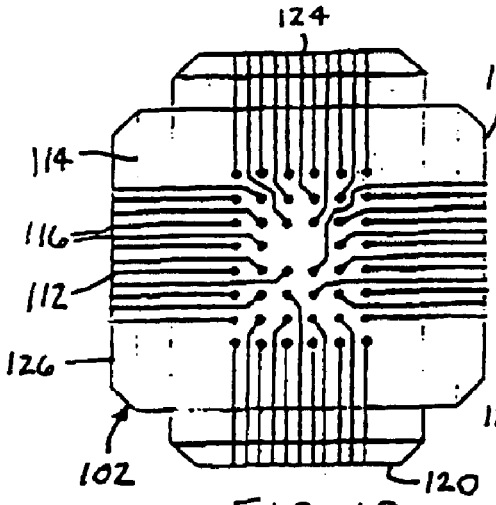
FIG. 19 is a top view of a flex circuit used in the IC package of FIG. 16.
Figure 20:
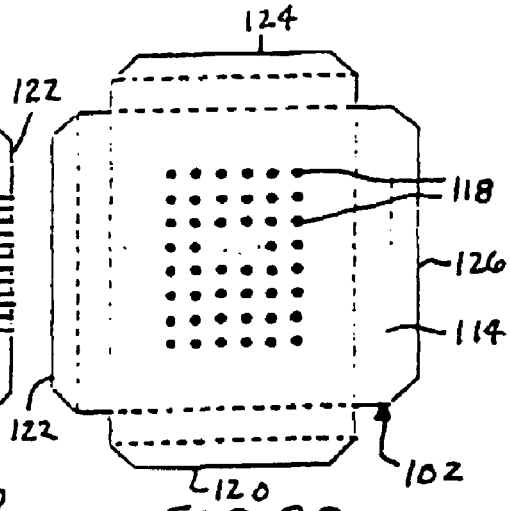
FIG. 20 is a bottom view of the flex circuit of FIG. 19.
Figure 21:
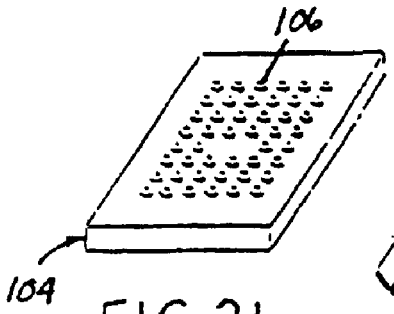
FIG. 21 is a perspective view of a BGA device used in the IC package of FIG. 16.

FIGS. 16 and 17 are upper and lower perspective views, respectively, of a stackable flex circuit IC package 100 for a IC package of the type having conductive elements protruding therefrom, according to the present invention. FIG. 18 is a block diagram of the successive steps of a method of making the IC package 100. FIGS. 19 and 20 are top and bottom views of a flex circuit 102 used in the IC package 100. FIG. 21 is a perspective view of an IC device 104 which may be used in the IC package 100. In the present example, the IC device 104 is a BGA device in the form of a μBGA package having a matrix of balls 106 on a surface thereof. However, other BGA devices with protruding contacts, such as chip scale packages or flip chips, can be used in the IC package 100.

FIG. 18 shows the successive steps of a method of making the IC package 100. In a first step 110, the flex circuit 102 shown in FIGS. 19 and 20 is formed. A layer of conductive metal, such as copper, is deposited on a thin flexible base 114 and is etched to form a conductive pattern 112. The conductive pattern 112 of the flex circuit 102 includes a plurality of separated conductors 116, in the manner of the flex circuit 12 of the IC package 10. However, in the case of the flex circuit 102, each of the conductors 116 is routed to one of an array or grid of apertures 118 formed so as to extend through the thin flexible base 114. In addition, the conductive pattern 112 formed by the conductors 116 extends to four opposite end portions 120, 122, 124 and 126 of the thin flexible base 114. The apertures 118 may be ablated through the thin flexible base 114 using a laser. After the apertures 118 are ablated with the laser, the copper of the conductors 116 reflects the laser, and is unaffected by the laser. The array or grid of apertures 118 corresponds to the balls 106 on the BGA device 104 so as to receive the balls 106 therein when the BGA device 104 is mounted on the flex circuit 102, as described hereafter. Ablation of the holes or apertures 118 through the center portion of the thin flexible base 114 of the flex circuit 102 is set forth as a second step 128 in the method of FIG. 18. In a following third step 130, the BGA device 104 is provided.

In a fourth step 132 of the method of FIG. 18, the array of balls 106 of the BGA device 104 are disposed in the apertures 118 in the flex circuit 102 and are soldered to the conductive pattern 112 on the opposite side of the flex circuit 102. This is accomplished by placing the BGA device 104 over the bottom surface of the flex circuit 102 shown in FIG. 20, so that the balls 106 of the BGA device 104 extend through the apertures 118 and into contact with the conductive pattern 112 on the opposite side of the flex circuit 102. Coating the balls 106 with solder paste or flux prior to placement of the chip package 104 on the flex circuit 102, followed by the application of heat, effects soldering of the balls 106 to the conductive pattern 112.

As previously described, the conductive pattern 112 is comprised of the individual conductors 116 as shown in FIG. 19. With the BGA device 104 mounted on the flex circuit 102, the individual balls 106 are soldered to contacts at the ends of the conductors 116. In this manner, the BGA device 104 is electrically coupled to parts of the conductive pattern 112 at the end portions 120, 122, 124 and 126 of the thin flexible base 114 of the flex circuit 102.

Figure 22:
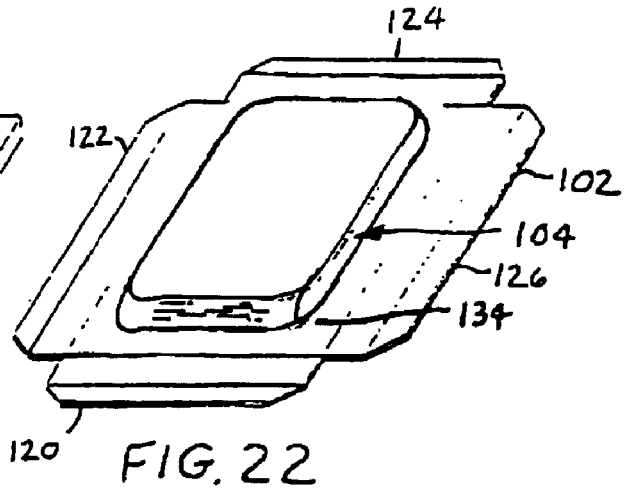
FIG. 22 is a perspective view of the BGA device of FIG. 21 as it is mounted on the flex circuit of FIG. 19.
Figure 23:
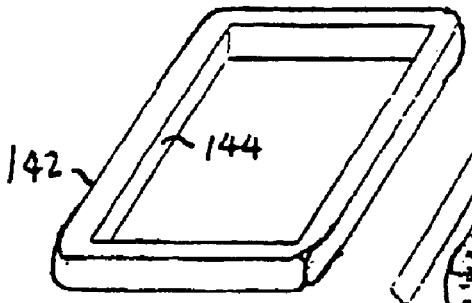
FIG. 23 is a perspective view of a frame used in the IC package of FIG. 16.
Figure 25:
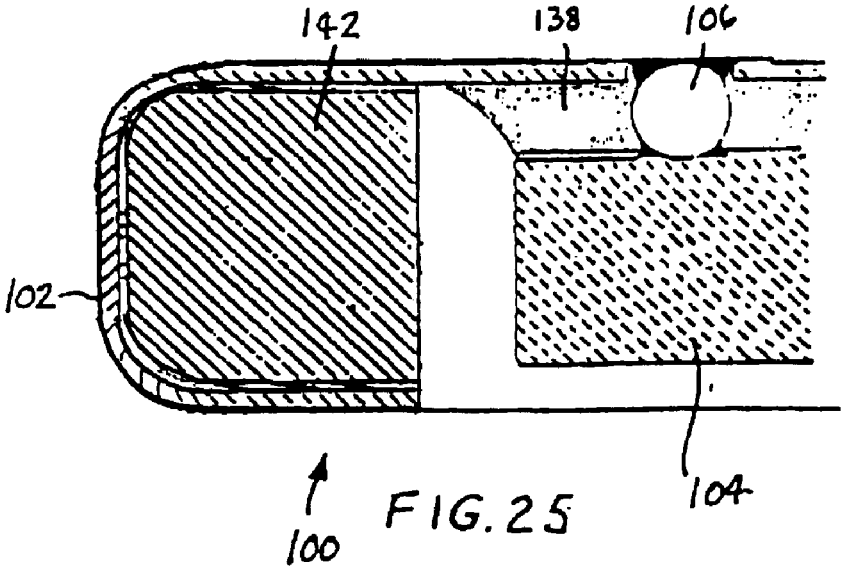
FIG. 25 is a sectional view of the IC package of FIG. 16 taken along the line 25—25 of FIG. 17.

FIG. 22 shows the BGA device 104 as so mounted on the flex circuit 102 and with the balls 106 thereof soldered to the conductive pattern 112. With the BGA device 104 thus mounted, a relatively small space 134 exists between a surface of the BGA device 104 and the flex circuit 102. This is because the balls 106 are larger than the thickness of the flexible base 114. In a fifth step 136 of the method of FIG. 18, the space 134 is underfilled with epoxy. The underfilled epoxy 138 is shown in the sectional view of FIG. 25.

As an alternative to soldering the balls 106 to the conductive pattern 112 and then underfilling with epoxy, an anisotropic adhesive can be used. The adhesive is spread on the flex circuit 102, and the BGA device 104 is then placed thereon and cured. This connects the balls 106 to the circuit 102 and bonds the BGA device 104 to the flex circuit.

Figure 24:
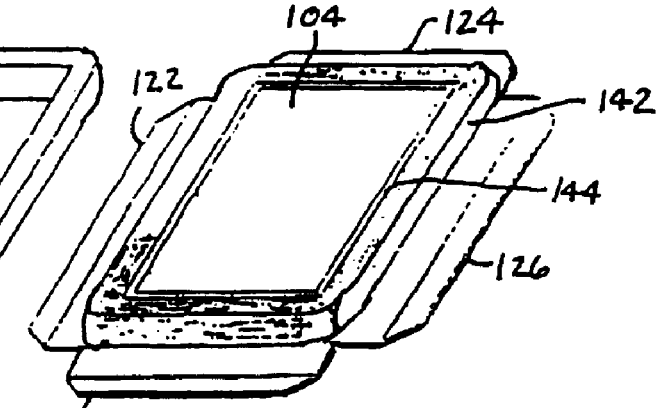
FIG. 24 is a perspective view similar to the view of FIG. 22 but with the frame of FIG. 23 mounted on the flex circuit together with the BGA device of FIG. 21.

In a sixth step 140 of the method of FIG. 18, a frame 142 is provided. The frame 142 has a central aperture 144 therein. As in the case of the frame 18 of the IC package 10, the frame 142 may be made from heat resistant plastic. In a seventh step 146 of the method of FIG. 18, the frame 142 is placed over the IC package 104 and is attached to the central portion of the flex circuit 102 with adhesive. This is shown in FIG. 24.

In an eighth and final step 148 of the method of FIG. 18, the end portions 120, 122, 124 and 126 of the thin flexible base 114 of the flex circuit 102 are folded over the frame 142 and are secured in place with adhesive, to complete the stackable flex circuit IC package 100. The completed IC package 100 is shown in FIGS. 16 and 17. All four of the opposite edge portions of the IC package 100 expose the conductive pattern 112 thereat, in preparation for electrical coupling thereof to the conductive pattern of an adjacent IC package 100 when a stack of the IC packages 100 is formed.

Figure 26:
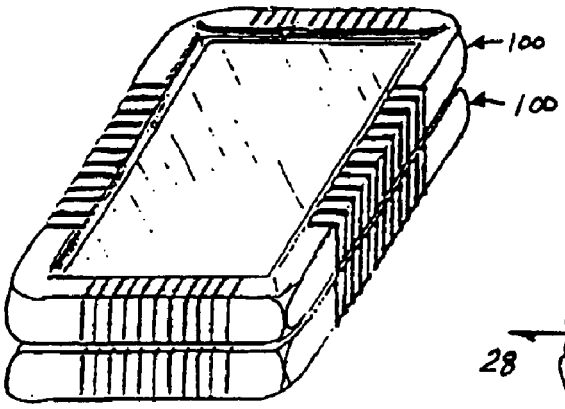
FIG. 26 is a perspective view of a stack of two of the IC packages of FIG. 16.
Figure 27:
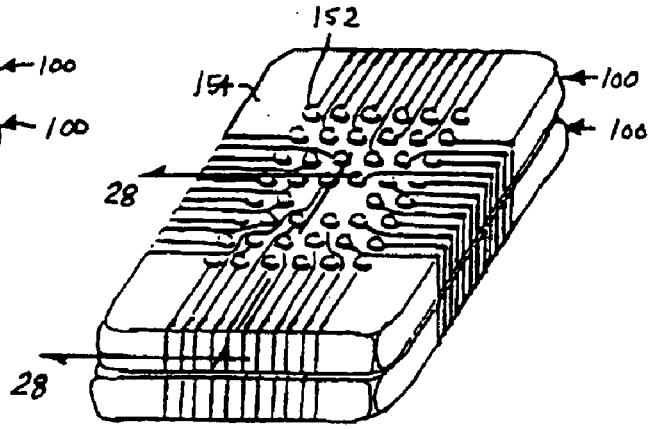
FIG. 27 is an inverted perspective view of the stack of FIG. 26.

FIGS. 26 and 27 show a stack of two of the IC packages 100. As in the case of the stack of FIG. 10 which is comprised of a pair of the IC packages 10, the stack of FIGS. 26 and 27 employs conductive epoxy and the application of pressure to form vertical or Z-axis conductive paths between the conductors 116 of adjacent portions of the conductive patterns of the IC packages 100. The conductive epoxy is applied to the conductive pattern 112 at each of the end portions 120, 122, 124 and 126 of the thin flexible base 114 of the conductive pattern 112.

Figure 28:
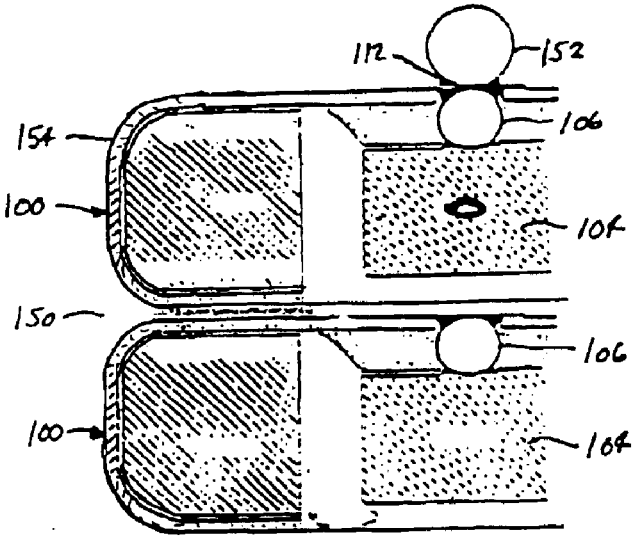
FIG. 28 is a sectional view of a portion of the stack of FIG. 26 taken along the line 28—28 of FIG. 27.

FIG. 28 is a sectional view of a portion of the stack of IC packages 100 shown in FIGS. 26 and 27. As shown in FIG. 28, a quantity of conductive epoxy 150 is placed between adjacent portions of the IC packages 100. Upon application of heat and pressure to the epoxy, vertical or Z-axis conductive pads are formed between the conductors 116 within the adjacent conductive patterns 112 of the IC packages 100. As shown in FIG. 28, conductive balls 152 may be soldered to portions of the conductive pattern 112 opposite the balls 106 of the IC package 104 in a lowermost one 154 of the IC packages 100. This facilitates mounting and electrical interconnection of the stack of FIGS. 26 and 27 on a substrate board.

Figure 29:
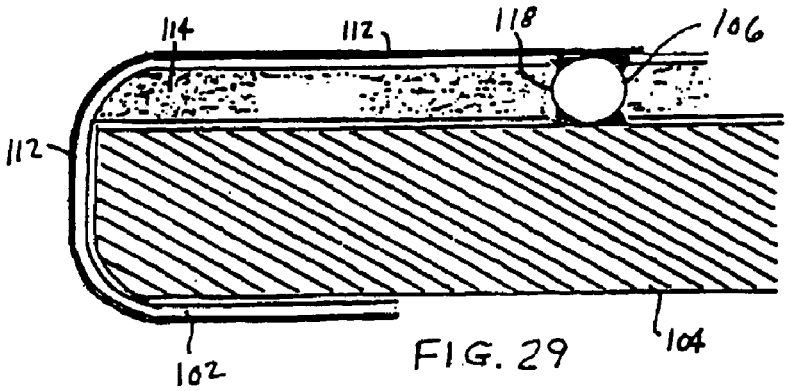
FIG. 29 is a sectional view of an alternative embodiment of a IC package in accordance with the invention.

FIG. 29 is a sectional view of a variation of the stackable flex circuit IC package 100 in which the frame 142 is eliminated. This arrangement is particularly useful in cases where the IC device 104 is relatively large and the opposite top and bottom surfaces thereof are parallel. In such instances, the opposite edges of the IC device 104 function as the frame, with the end portions 120, 122, 124 and 126 of the thin flexible base 114 of the conductive pattern 112 being folded over and secured by adhesive thereto. The central portion of the flex circuit 102 is provided with the apertures 118 in the manner previously described, so that the balls 106 of the BGA device 104 are soldered to the conductive pattern 112 upon mounting of the IC package 104. The space between the flex circuit 102 and the BGA device 104 is underfilled with epoxy in the manner previously described.

The arrangement of FIG. 29 is best employed in cases where the opposite surfaces of the IC device are parallel to each other. For non-parallel surfaces, a frame can be molded to fit the chip, and is used in forming the IC package.

While the stackable flex circuit IC packages described herein have a single IC device mounted therein, it will be apparent that packages can be assembled with more than one IC device therein. In such instances, the plural IC devices can be interconnected using multilayered flex circuits. Also, transposer layers can be made as an integral part of the flex circuit of each carrier or as separate boards between carriers when stacking carriers.

While the invention has been shown with reference to preferred embodiments thereof, it will be understood by those skilled in the art that various changes in form and details may be made therein without departing from the spirit and scope of the invention.

I claim:

1. A stackable integrated circuit chip package, comprising:

a flex circuit comprising:

a flexible base; and a conductive pattern disposed on the flexible base;

a frame defining a central opening and opposed top and bottom surfaces, the flex circuit being wrapped around at least a portion of and secured to the frame such that the, conductive pattern defines a first portion which extends over a portion of the bottom surface of the frame and a second portion which extends over a portion of the top surface of the frame; and an integrated circuit device disposed within the opening of the frame and secured to the flexible base of the flex circuit, the integrated circuit device being electrically connected to the conductive pattern;

the first and second portions of the conductive pattern each being electrically connectable to another component.

2. The chip package of claim 1 further in combination with a second stackable integrated circuit chip package identically configured to the chip package, the first portion of the conductive pattern of the second chip package being electrically connected to the second portion of the conductive pattern of the chip package to form a chip stack.

3. The chip stack of claim 2 wherein the first portion of the conductive pattern of the second chip package is electrically connected to the second portion of the conductive pattern of the chip package through the use of an anisotropic conductive epoxy.

4. The chip package of claim 1 wherein:

the integrated circuit device comprises a bare die; and the bare die is electrically connected to the second portion of the conductive pattern via at least one conductive wire.

5. The chip package of claim 4 wherein:

the top surface of the frame defines at least one ramp which is recessed relative to the remainder thereof;

a portion of the second portion of the conductive pattern extends over the ramp; and the bare die is electrically connected via the conductive wire to the portion of the second portion of the conductive pattern which extends over the ramp.

6. The chip package of claim 5 further comprising a potting compound encapsulating the bare die and the at least one conductive wire within the central opening of the frame.

7. The chip package of claim 1 wherein:

the integrated circuit device comprises a BGA device including a body having an array of contacts disposed thereon;

the flexible base of the flex circuit includes a plurality of apertures extending therethrough to the first portion of the conductive pattern; and the contacts of the BGA device are disposed within respective ones of the apertures and electrically connected to the first portion of the conductive pattern.

8. The chip package of claim 7 wherein the contacts are electrically connected to the first portion of the conductive pattern via solder.

9. The chip package of claim 7 further comprising a potting compound underfilling a gap defined between the body of the BGA device and the flexible base of the flex circuit.

10. The chip stack of claim 1 wherein the flexible base extends across and completely covers one end of the central opening within the frame.

11. A chip stack comprising:

at least first and second stackable integrated circuit chip packages, each of which comprises:

a flex circuit comprising:

a flexible base; and a conductive pattern disposed on the flexible base;

a frame defining a central opening, the flex circuit being wrapped around at least a portion of and secured to the frame such that the conductive pattern defines a first portion which extends over a portion of the bottom surface of the frame and a second portion which extends over a portion of the top surface of the frame; and an integrated circuit device disposed within the opening of the frame and secured to the flexible base of the flex circuit, the integrated circuit device being electrically connected to the conductive pattern;

the first portion of the conductive pattern of the second chip package being electrically connected to the second portion of the conductive pattern of the first chip package.

12. The chip stack of claim 11 wherein the first portion of the conductive pattern of the first chip package is electrically connected to the second portion of the conductive pattern of the second chip package-via an anisotropic epoxy.

13. The chip stack of claim 11 wherein the second chip package includes a plurality of contacts on the first portion of the conductive pattern thereof to facilitate electrical connection to a substrate board.

14. A stackable integrated circuit chip package, comprising:

a flex circuit comprising:

a flexible base having a central aperture therein; and a conductive pattern disposed on the flexible base;

a frame defining a central opening and opposed top and bottom surfaces, the flex circuit being wrapped around at least a portion of and secured to the frame such that the conductive pattern defines a first portion which extends over a portion of the bottom surface of the frame and a second portion which extends over a portion of the top surface of the frame; and an integrated circuit device disposed within the central aperture of the flexible base and the central opening of the frame, the integrated circuit device being electrically connected to the conductive pattern;

the first and second portions of the conductive pattern each being electrically connectable to another component.

15. The chip package of claim 14 further in combination with a second stackable integrated circuit chip package identically configured to the chip package, the first portion of the conductive pattern of the second chip package being electrically connected to the second portion of the conductive pattern of the chip package to form a chip stack.

16. The chip stack of claim 15 wherein the first portion of the conductive pattern of the second chip package is electrically connected to the second portion of the conductive pattern of the chip package through the use of an anisotropic conductive epoxy.

17. The chip package of claim 14 wherein:

the integrated circuit device comprises a bare die; and the bare die is electrically connected to the second portion of the conductive pattern via at least one conductive wire.

18. The chip package of claim 17 wherein:

the top surface of the frame defines at least one ramp which is recessed relative to the remainder thereof;

a portion of the second portion of the conductive pattern extends over the ramp; and the bare die is electrically connected via the conductive wire to the portion. of the second portion of the conductive pattern which extends over the ramp.

19. The chip package of claim 18 further comprising a potting compound partially encapsulating the bare die and-the at least one conductive wire within the central aperture of the flexible base and the central opening of the frame.

*20. A stacked integrated circuit module comprising:*

*a first ball grid array package having a first major surface and a second major surface and emergent from the second major surface there being a first matrix of balls, the first ball grid array package containing an integrated circuit chip;*

*a second ball grid array package having a first major surface and a second major surface and containing an integrated circuit chip, the second ball grid array package being disposed in a stacked disposition above the first ball grid array package;*

*a flex circuit connected on one side to the first matrix of balls of the first ball grid array package and connected on the other side to a second matrix of balls for the module the flex circuit further comprising a first portion and a second portion with the first and second portions being coplanarly disposed above the first major surface of the first ball grid array package and below the second major surface of the second ball grid array package, the first and second portions being electrically connected to the second ball grid array package.*

* * * * *

UNITED STATES PATENT AND TRADEMARK OFFICE

CERTIFICATE OF CORRECTION

PATENT NO. : RE 39,628 E
APPLICATION NO. : 10/900073
DATED : May 15, 2007
INVENTOR(S) : Harlan R. Isaak It is certified that error appears in the above-identified patent and that said Letters Patent is hereby corrected as shown below:

Title page, Item (73) Assignee: please change "Stakick Group, L.P." to --Staktek Group L.P.--

Signed and Sealed this

Third Day of July, 2007

JON W. DUDAS
*Director of the United States Patent and Trademark Office*